United States Patent
Lee

(10) Patent No.: US 10,247,871 B2
(45) Date of Patent: Apr. 2, 2019

(54) OPTICAL SHEET, DISPLAY DEVICE AND LIGHT EMITTING DEVICE HAVING THE SAME

(75) Inventor: Sun Hwa Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 341 days.

(21) Appl. No.: 14/356,657

(22) PCT Filed: Aug. 8, 2012

(86) PCT No.: PCT/KR2012/006308
§ 371 (c)(1),
(2), (4) Date: Sep. 30, 2014

(87) PCT Pub. No.: WO2013/069878
PCT Pub. Date: May 16, 2013

(65) Prior Publication Data
US 2015/0036379 A1    Feb. 5, 2015

(30) Foreign Application Priority Data

Nov. 7, 2011    (KR) .................. 10-2011-0115394

(51) Int. Cl.
*F21V 8/00* (2006.01)
*G02B 5/02* (2006.01)
(Continued)

(52) U.S. Cl.
CPC ........... *G02B 6/005* (2013.01); *G02B 5/0226* (2013.01); *G02B 6/0051* (2013.01); *G02F 1/133617* (2013.01); *G02F 1/133504* (2013.01); *G02F 1/133603* (2013.01); *G02F 1/133611* (2013.01); *G02F 2001/133562* (2013.01);
(Continued)

(58) Field of Classification Search
CPC ............... G02B 6/0033; G02B 6/0035; G02F 1/133615; G02F 1/133617
See application file for complete search history.

(56) References Cited

U.S. PATENT DOCUMENTS 5,998,925 A * 12/1999 Shimizu ............. C09K 11/7767
257/103
7,004,610 B2    2/2006 Yamashita et al.
(Continued)

FOREIGN PATENT DOCUMENTS

CN    1758114 A    4/2006
CN    1869788 A    11/2006
(Continued)

OTHER PUBLICATIONS

Office Action dated Jan. 28, 2016 in Chinese Application No. 201280066300.9.
(Continued)

*Primary Examiner* — Alexander K Garlen
*Assistant Examiner* — Colin J Cattanach
(74) *Attorney, Agent, or Firm* — Saliwanchik, Lloyd & Eisenschenk

(57) ABSTRACT

Disclosed are an optical member and a display device including the same. The optical member includes a light conversion layer including a plurality of light conversion particles; and a light diffusion layer including a plurality of light path conversion particles under the light conversion layer.

7 Claims, 4 Drawing Sheets

(51) Int. Cl.
*H01L 33/50* (2010.01)
*G02F 1/1335* (2006.01)

(52) U.S. Cl.
CPC .. *G02F 2001/133614* (2013.01); *H01L 33/50* (2013.01); *H01L 2224/48091* (2013.01); *H01L 2924/12044* (2013.01)

(56) References Cited

U.S. PATENT DOCUMENTS

| | | | |
|---|---|---|---|
| 7,040,774 B2 | 5/2006 | Beeson et al. | |
| 7,481,562 B2 | 1/2009 | Chua et al. | |
| 7,795,055 B2* | 9/2010 | Lee | H01L 33/508 |
| | | | 257/100 |
| 8,038,822 B2 | 10/2011 | Kindler et al. | |
| 8,545,083 B2 | 10/2013 | Terajima et al. | |
| 9,110,200 B2* | 8/2015 | Nichol | G02B 6/006 |
| 9,199,842 B2* | 12/2015 | Dubrow | B82Y 20/00 |
| 9,244,209 B2 | 1/2016 | Lee et al. | |
| 9,304,355 B2 | 4/2016 | Lee | |
| 9,335,459 B2 | 5/2016 | Kang | |
| 2001/0001207 A1* | 5/2001 | Shimizu | C09K 11/7774 |
| | | | 257/98 |
| 2002/0001055 A1* | 1/2002 | Kimura | G02B 5/0226 |
| | | | 349/112 |
| 2002/0071071 A1 | 6/2002 | Sekiguchi et al. | |
| 2002/0130985 A1* | 9/2002 | Weindorf | G02B 6/0068 |
| | | | 349/61 |
| 2002/0140880 A1* | 10/2002 | Weindorf | G02B 6/0023 |
| | | | 349/70 |
| 2003/0042845 A1* | 3/2003 | Pires | G02F 1/133617 |
| | | | 313/501 |
| 2003/0066998 A1 | 4/2003 | Lee | |
| 2003/0165781 A1 | 9/2003 | Takeda | |
| 2004/0046242 A1 | 3/2004 | Asakawa | |
| 2004/0190279 A1 | 9/2004 | Kitamura | |
| 2005/0001225 A1* | 1/2005 | Yoshimura | C04B 35/584 |
| | | | 257/98 |
| 2005/0221519 A1 | 10/2005 | Leung et al. | |
| 2006/0002101 A1 | 1/2006 | Wheatley et al. | |
| 2006/0034084 A1 | 2/2006 | Matsuura et al. | |
| 2006/0034579 A1 | 2/2006 | Sugiura | |
| 2006/0072315 A1 | 4/2006 | Han et al. | |
| 2006/0092666 A1* | 5/2006 | Jeong | G02F 1/133603 |
| | | | 362/613 |
| 2006/0132034 A1 | 6/2006 | Cho et al. | |
| 2006/0176562 A1* | 8/2006 | Goto | G02B 5/021 |
| | | | 359/599 |
| 2006/0227532 A1 | 10/2006 | Ko et al. | |
| 2006/0227570 A1 | 10/2006 | Rutherford et al. | |
| 2006/0268537 A1* | 11/2006 | Kurihara | G02B 6/0023 |
| | | | 362/34 |
| 2006/0268579 A1* | 11/2006 | Han | G02B 6/0051 |
| | | | 362/629 |
| 2007/0004195 A1* | 1/2007 | Park | G02F 1/133604 |
| | | | 438/626 |
| 2007/0012940 A1* | 1/2007 | Suh | H01L 33/507 |
| | | | 257/99 |
| 2007/0176196 A1* | 8/2007 | Kim | H01L 33/50 |
| | | | 257/99 |
| 2007/0210326 A1* | 9/2007 | Kurihara | G02B 6/005 |
| | | | 257/98 |
| 2007/0221865 A1* | 9/2007 | Sohn | C09K 11/7731 |
| | | | 250/484.4 |
| 2007/0221866 A1* | 9/2007 | Sohn | C09K 11/7731 |
| | | | 250/484.4 |
| 2007/0221943 A1* | 9/2007 | Moriya | G02F 1/133603 |
| | | | 257/99 |
| 2007/0228390 A1 | 10/2007 | Hattori et al. | |
| 2007/0229736 A1 | 10/2007 | Wang et al. | |
| 2007/0263408 A1 | 11/2007 | Chua | |
| 2008/0037272 A1* | 2/2008 | Song | B29D 11/00663 |
| | | | 362/561 |
| 2008/0074903 A1* | 3/2008 | Nam | G02B 6/0068 |
| | | | 362/613 |
| 2008/0112186 A1* | 5/2008 | Jung | G02F 1/133611 |
| | | | 362/609 |
| 2008/0237540 A1 | 10/2008 | Dubrow | |
| 2008/0284316 A1 | 11/2008 | Kurihara et al. | |
| 2009/0014688 A1 | 1/2009 | Hoshino et al. | |
| 2009/0021148 A1 | 1/2009 | Hachiya et al. | |
| 2009/0026908 A1* | 1/2009 | Bechtel | C09K 11/7774 |
| | | | 313/110 |
| 2009/0034292 A1 | 2/2009 | Pokrovskiy et al. | |
| 2009/0040598 A1 | 2/2009 | Ito | |
| 2009/0115936 A1 | 5/2009 | Takeuchi et al. | |
| 2009/0147497 A1* | 6/2009 | Nada | G02B 6/0023 |
| | | | 362/84 |
| 2009/0152567 A1 | 6/2009 | Comerford et al. | |
| 2009/0173957 A1 | 7/2009 | Brunner et al. | |
| 2009/0231847 A1 | 9/2009 | Pan et al. | |
| 2010/0079701 A1* | 4/2010 | Murayama | G02B 5/0226 |
| | | | 349/64 |
| 2010/0079901 A1 | 4/2010 | Fukushima | |
| 2010/0110728 A1 | 5/2010 | Dubrow et al. | |
| 2010/0155749 A1 | 6/2010 | Chen et al. | |
| 2010/0164364 A1 | 7/2010 | Eida et al. | |
| 2010/0187975 A1* | 7/2010 | Tsukahara | G02B 6/0038 |
| | | | 313/503 |
| 2010/0232133 A1 | 9/2010 | Tran et al. | |
| 2010/0232134 A1 | 9/2010 | Tran | |
| 2010/0283072 A1* | 11/2010 | Kazlas | G02B 6/005 |
| | | | 257/98 |
| 2010/0295438 A1 | 11/2010 | Ott et al. | |
| 2010/0302493 A1* | 12/2010 | Yang | G02F 1/13452 |
| | | | 349/150 |
| 2010/0315320 A1 | 12/2010 | Yoshida | |
| 2011/0001148 A1* | 1/2011 | Sun | H01L 33/60 |
| | | | 257/88 |
| 2011/0002140 A1* | 1/2011 | Tsukahara | G02B 5/0236 |
| | | | 362/602 |
| 2011/0037926 A1 | 2/2011 | Tsukahara et al. | |
| 2011/0044046 A1 | 2/2011 | Abu-Ageel | |
| 2011/0090696 A1 | 4/2011 | Nagai et al. | |
| 2011/0141769 A1 | 6/2011 | Lee et al. | |
| 2011/0156575 A1 | 6/2011 | Yu et al. | |
| 2011/0176328 A1 | 7/2011 | Anandan et al. | |
| 2011/0199787 A1* | 8/2011 | Kim | G02B 6/0023 |
| | | | 362/612 |
| 2011/0205750 A1 | 8/2011 | Krijn et al. | |
| 2011/0249424 A1 | 10/2011 | Joo et al. | |
| 2011/0261303 A1 | 10/2011 | Jang et al. | |
| 2011/0299011 A1 | 12/2011 | Weiss et al. | |
| 2012/0106197 A1* | 5/2012 | Lai | B32B 37/12 |
| | | | 362/609 |
| 2012/0113672 A1* | 5/2012 | Dubrow | B82Y 20/00 |
| | | | 362/602 |
| 2012/0170282 A1* | 7/2012 | Lin | G02B 6/0036 |
| | | | 362/341 |
| 2013/0128548 A1 | 5/2013 | Lin | |
| 2014/0049826 A1 | 2/2014 | Lee et al. | |
| 2014/0153218 A1 | 6/2014 | Hyun | |
| 2014/0160789 A1 | 6/2014 | Park | |
| 2014/0168571 A1 | 6/2014 | Hyun | |
| 2015/0369993 A1 | 12/2015 | Kim et al. | |
| 2016/0363713 A1* | 12/2016 | Dubrow | B82Y 20/00 |

FOREIGN PATENT DOCUMENTS

| | | |
|---|---|---|
| CN | 1880839 A | 12/2006 |
| CN | 1881034 A | 12/2006 |
| CN | 101975371 A | 2/2011 |
| EP | 2068193 A2 | 6/2009 |
| JP | 09073807 A | 3/1997 |
| JP | 2004303441 A | 10/2004 |
| JP | 2004315661 A | 11/2004 |
| JP | 2007005098 A | 1/2007 |
| JP | 2007173754 A | 7/2007 |
| JP | 2008287073 A | 11/2008 |
| JP | 2008311234 A | 12/2008 |
| JP | 2009200534 A | 9/2009 |

(56) References Cited

FOREIGN PATENT DOCUMENTS

| | | | |
|---|---|---|---|
| JP | 2010123918 A | 6/2010 |
| KR | 20060056834 A | 5/2006 |
| KR | 10-2006-0129835 A | 12/2006 |
| KR | 20060125535 A | 12/2006 |
| KR | 10-2007-0092440 A | 9/2007 |
| KR | 20080007247 A | 1/2008 |
| KR | 10-2008-0063986 A | 7/2008 |
| KR | 20090021912 A | 3/2009 |
| KR | 20100024420 A | 3/2010 |
| KR | 20100027892 A | 3/2010 |
| KR | 10-2010-0047841 A | 5/2010 |
| KR | 20100046698 A | 5/2010 |
| KR | 20100118557 A | 11/2010 |
| KR | 20100129030 A | 12/2010 |
| KR | 20110012246 A | 2/2011 |
| KR | 20110068110 A | 6/2011 |
| KR | 20120001387 A | 1/2012 |
| KR | 1020120070449 A | 6/2012 |
| KR | 1020130009022 A | 1/2013 |
| TW | 200409384 | 6/2004 |
| TW | 200702822 | 1/2007 |
| TW | 200739192 | 10/2007 |
| TW | 200803600 A | 1/2008 |
| TW | 200848809 A | 12/2008 |
| TW | 201035484 A | 10/2010 |
| TW | 201041191 A | 11/2010 |
| TW | 201044067 A | 12/2010 |
| TW | 201105767 A | 2/2011 |
| WO | WO-2012144720 A1 | 10/2012 |

OTHER PUBLICATIONS

International Search Report in International Application No. PCT/KR2012/006308, filed Aug. 8, 2012.
International Search Report in International Application No. PCT/KR2012/004625, dated Dec. 24, 2012.
Notice of Allowance dated Apr. 12, 2013 in Korean Application No. 10-2011-0071135.
European Search Report in European Application No. 12814589.3, dated Apr. 16, 2015.
Office Action dated Jun. 25, 2014 in Taiwanese Application No. 10-1121880.
Final Office Action dated Jul. 30, 2015 in U.S. Appl. No. 14/233,440.
European Search Report dated Sep. 7, 2015 in European Application No. 15172626.2.
International Search Report in International Application No. PCT/KR2012/004611, filed Jun. 11, 2012.
Taiwanese Office Action dated Jan. 23, 2015 in Taiwanese Application No. 101125849.
European Search Report dated Feb. 12, 2015 in International Application No. PCT/KR2012/004611.
International Search Report in International Application No. PCT/KR2012/004521, filed Jun. 8, 2012.
Office Action dated Dec. 3, 2014 in Taiwanese Application No. 101121510.
Office Action dated Dec. 24, 2012 in Korean Application No. 10-2011-0069797.
Office Action dated Aug. 18, 2015 in U.S. Appl. No. 14/232,843.
International Search Report in International Application No. PCT/KR2011/009232, filed Nov. 30, 2011.
Office Action dated Jul. 31, 2012 in Korean Application No. 10-2011-0009833.
Office Action dated Mar. 13, 2015 in U.S. Appl. No. 13/982,916.
Office Action dated Mar. 16, 2016 in U.S. Appl. No. 13/982,916.
Office Action dated Aug. 30, 2016 in U.S. Appl. No. 14/234,123.
Office Action dated Jun. 19, 2015 in U.S. Appl. No. 14/234,123.
Office Action dated Dec. 14, 2016 in U.S. Appl. No. 14/234,123.
Office Action dated Nov. 25, 2016 in U.S. Appl. No. 14/747,577.
Office Action dated Dec. 29, 2016 in U.S. Appl. No. 15/136,239.
Office Action dated Jul. 5, 2016 in U.S. Appl. No. 14/356,657.
Office Action dated Jan. 5, 2017 in U.S. Appl. No. 14/356,657.
European Search Report in European Application No. 12814403.7 dated Feb. 13, 2015.
International Search Report in International Application No. PCT/KR2012/005418, filed Jul. 9, 2012.
Office Action dated Apr. 6, 2016 in Taiwanese Application No. 101126235.
Office Action dated Jul. 6, 2015 in U.S. Appl. No. 14/234,117.
Office Action dated Jan. 21, 2016 in U.S. Appl. No. 14/234,117.
International Search Report in International Application No. PCT/KR2012/005353, filed Jul. 5, 2012.
European Search Report dated May 22, 2015 in European Application No. 12811675.3.
Office Action dated Jul. 6, 2015 in U.S. Appl. No. 14/232,850.
Office Action dated Jun. 1, 2016 in U.S. Appl. No. 14/232,850.
Notice of Allowance dated Nov. 17, 2016 in U.S. Appl. No. 14/232,850.
Office Action dated Jun. 24, 2014, in Taiwanese Application No. 101122681.
European Search Report in European Application No. 12815508.2 filed May 28, 2014.
International Search Report in International Application No. PCT/KR2012/004610, filed Dec. 24, 2012.
Office Action dated Sep. 18, 2017 in Taiwanese Application No. 105109462, along with its English translation.

* cited by examiner

[Fig. 1]
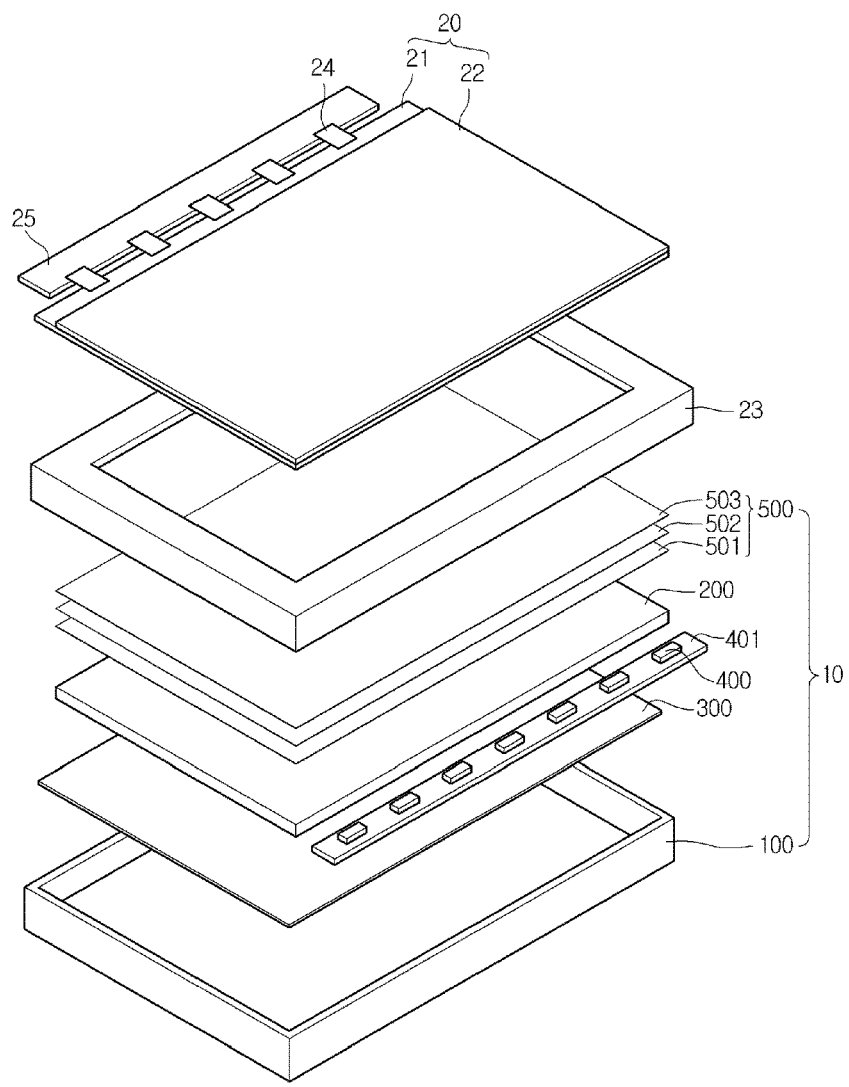
[Fig. 2]
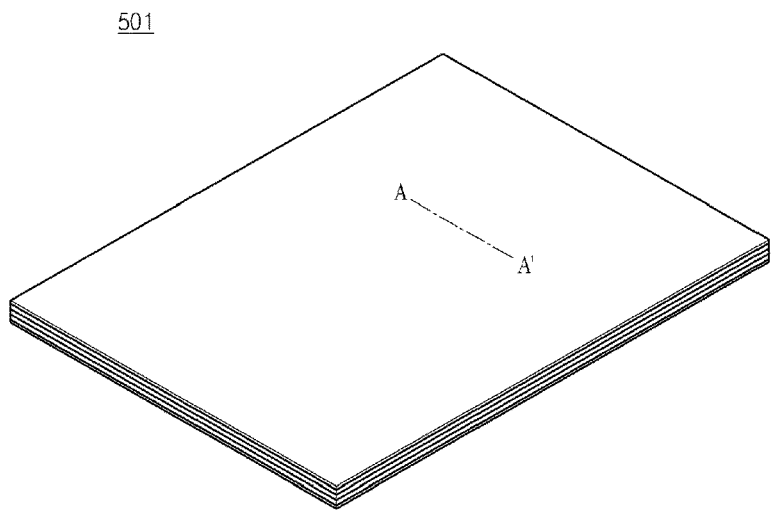

[Fig. 3]
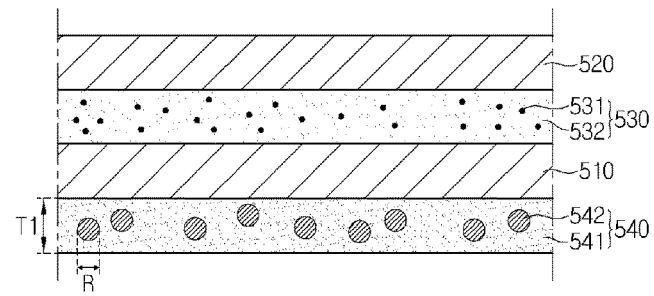
[Fig. 4]
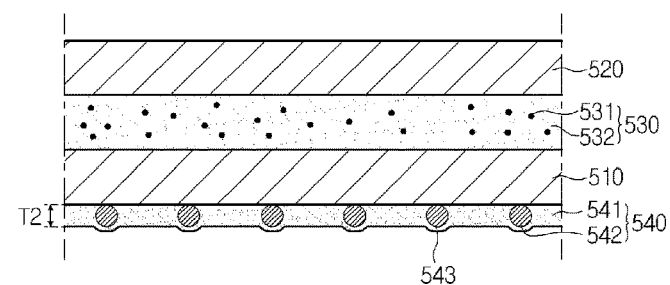
[Fig. 5]
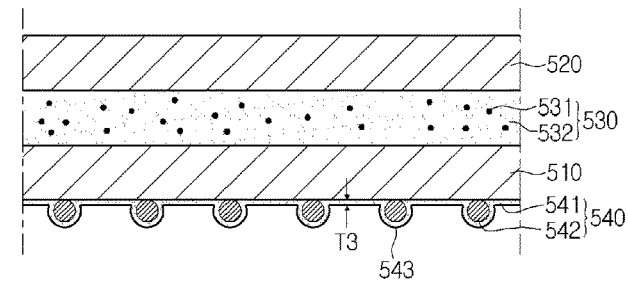
[Fig. 6]
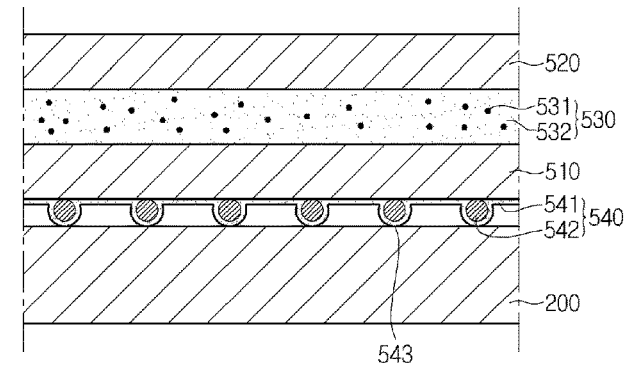
[Fig. 7]
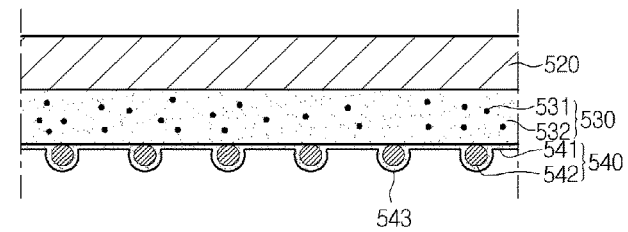

[Fig. 8]
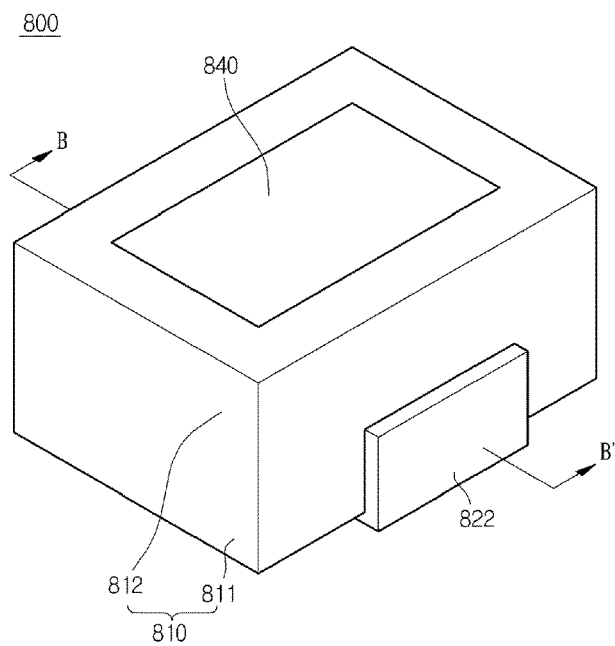
[Fig. 9]
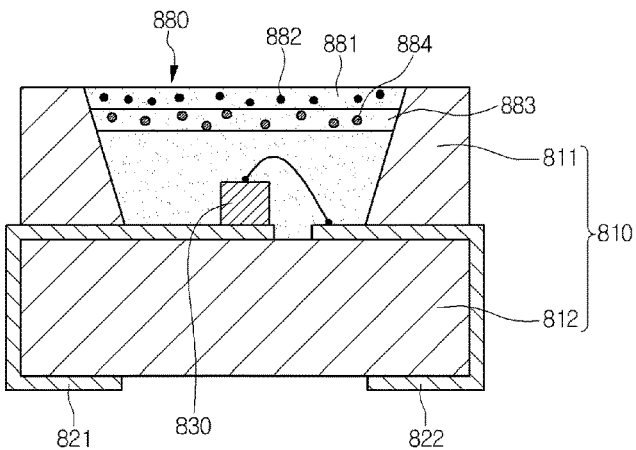
[Fig. 10]
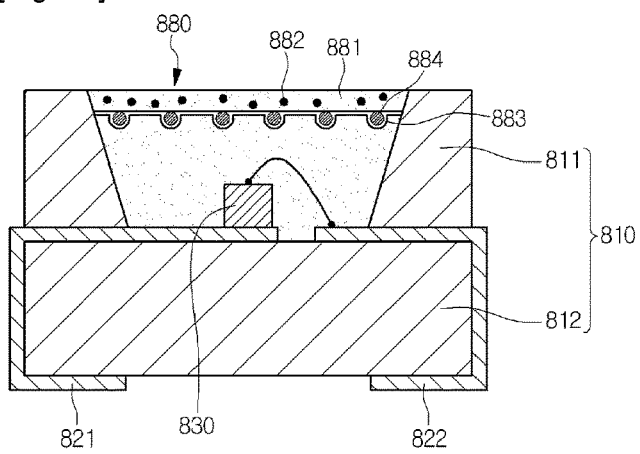

[Fig. 11]
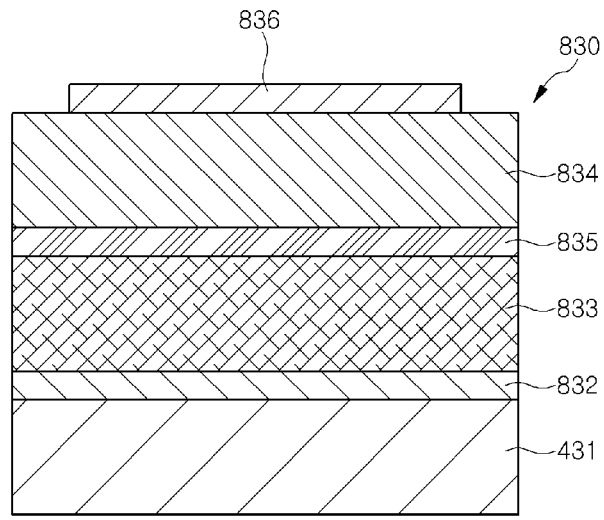
[Fig. 12]
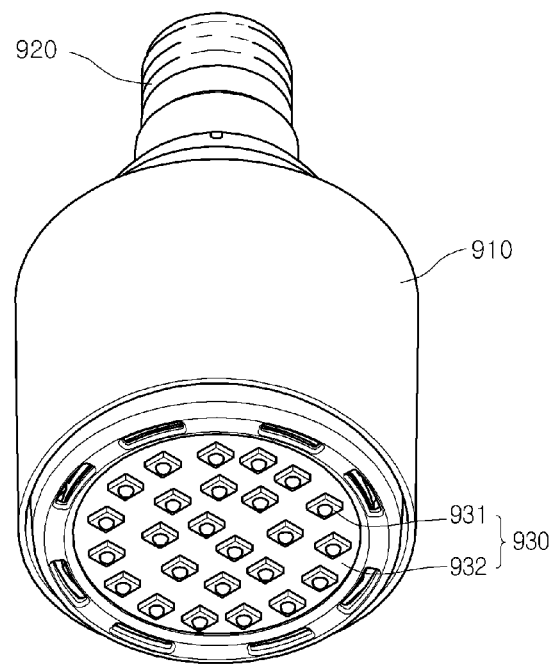

OPTICAL SHEET, DISPLAY DEVICE AND LIGHT EMITTING DEVICE HAVING THE SAME

CROSS-REFERENCE TO RELATED APPLICATIONS

This application is the U.S. national stage application of International Patent Application No. PCT/KR2012/006308, filed Aug. 8, 2012, which claims priority to Korean Application No. 10-2011-0115394, filed Nov. 7, 2011, the disclosures of each of which are incorporated herein by reference in their entirety.

TECHNICAL FIELD

The embodiment relates to an optical sheet, a display device and a light emitting device having the same.

BACKGROUND ART

Recently, flat display devices, such as an LCD (liquid crystal display), a PDA (plasma display panel) or an OLED (organic light emitting diode), have been increasingly developed instead of conventional CRTs (cathode ray tubes).

Among them, the LCD includes a liquid crystal display panel having a thin film transistor substrate, a color filter substrate and a liquid crystal injected between the thin film transistor substrate and the color filter substrate. Since the liquid crystal display panel is a non-emissive device, a backlight unit is provided below the thin film transistor substrate to supply light. Transmittance of the light emitted from the backlight unit is adjusted according to the alignment state of the liquid crystal.

The backlight unit is classified into an edge-illumination type backlight unit and a direct-illumination type backlight unit according to the position of a light source. According to the edge-illumination type backlight unit, the light source is located at a lateral side of a light guide plate.

The direct-illumination type backlight unit has been developed as the size of the LCD has become enlarged. According to the direct-illumination type backlight unit, at least one light source is located below the liquid crystal display panel to supply the light over the whole area of the liquid crystal display panel.

When comparing with the edge-illumination type backlight unit, the direct-illumination type backlight unit can employ a large number of light sources so that the high brightness can be achieved. In contrast, the direct-illumination type backlight unit must have thickness larger than thickness of the edge-illumination type backlight unit in order to ensure brightness uniformity.

In order to solve the above problem, a quantum dot bar having a plurality of quantum dots, which can convert blue light into red light or green light, is positioned in front of a blue LED that emits the blue light. Thus, as the blue light is irradiated onto the quantum dot bar, the blue light, the red light and the green light are mixed and the mixed light is incident into the light guide plate, thereby generating white light.

If the white light is supplied to the light guide plate by using the quantum dot bar, high color reproduction may be realized.

The backlight unit may include an FPCB (flexible printed circuit board) provided at one side of the blue LED to supply signals and power to the LEDs and a bonding member formed under the bottom surface of the FPCB.

The display device, which is capable of displaying various images using the white light supplied to the light guide plate through the quantum dot bar as the blue light is emitted from the blue LED, has been extensively used.

A display device employing such a quantum dot is disclosed in Korean Unexamined Patent Publication No. 10-2011-006810.

DISCLOSURE OF INVENTION

Technical Problem

The embodiment provides an optical sheet representing high brightness and superior color reproduction, a display device and a light emitting device having the same.

Solution to Problem

An optical member according to the embodiment includes a light conversion layer including a plurality of light conversion particles; and a light diffusion layer including a plurality of light path conversion particles under the light conversion layer.

A display device according to the embodiment includes a light source; a light conversion member into which light is incident from the light source; and a display panel into which the light is incident from the light conversion member, wherein the light conversion member includes a light conversion layer including a plurality of light conversion particles to convert a wavelength of the light emitted from the light source; and a light diffusion layer disposed before the light conversion layer on a basis of a path of the light from the light source and including a plurality of light path conversion particles.

A display device according to the embodiment includes a light source; an optical member into which light is incident from the light source; a light conversion member on the optical member; and a display panel on the light conversion member, wherein the light conversion member includes a plurality of protrusions protruding toward the optical member.

Advantageous Effects of Invention

The optical member and the display device according to the embodiment include the light diffusion layer disposed under the light conversion layer. Thus, the light emitted from the light source can be uniformly distributed through the light conversion layer. That is, the light having the improved brightness uniformity can be incident into the light conversion layer.

Therefore, the light conversion layer can convert the light having the improved brightness uniformity, so the light conversion efficiency can be improved.

In addition, the light diffusion layer includes the light path conversion particles. In addition, the light diffusion layer includes the protrusions corresponding to the light path conversion particles, respectively. The protrusions protrude downward.

Especially, the protrusions can directly make contact with the optical member, such as the light guide plate disposed below the protrusions. Due to the protrusions, the contact area can be uniformly formed between the optical conversion member and the light guide plate.

Therefore, the brightness non-uniformity, which is caused due to the local contact between the light conversion member and the light guide plate, can be prevented by the protrusions.

Thus, the optical member and the LCD according to the embodiment can maximize the light conversion efficiency of the light conversion layer while improving the brightness uniformity.

BRIEF DESCRIPTION OF DRAWINGS

FIG. 1 is an exploded perspective view showing a liquid crystal display according to the embodiment;

FIG. 2 is a perspective view showing a light conversion sheet according to the embodiment;

FIG. 3 is a sectional view taken along line A-A' of FIG. 2;

FIGS. 4 and 5 are sectional views showing various types of light conversion sheets;

FIG. 6 is a sectional view showing a light conversion sheet making contact with a light guide plate;

FIG. 7 is a sectional view showing a light conversion sheet according to another embodiment;

FIG. 8 is a perspective view showing a light emitting device package according to the embodiment;

FIG. 9 is a sectional view taken along line C-C' of FIG. 8;

FIG. 10 is a sectional view showing a light emitting diode chip according to the first embodiment;

FIG. 11 is a sectional view showing a light emitting diode chip according to the second embodiment; and FIG. 12 is a perspective view showing a lighting device according to the embodiment.

MODE FOR THE INVENTION

In the description of the embodiments, it will be understood that when a substrate, a frame, a sheet, a layer or a pattern is referred to as being "on" or "under" another substrate, another frame, another sheet, another layer, or another pattern, it can be "directly" or "indirectly" on the other substrate, frame, sheet, layer, or pattern, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

FIG. 1 is an exploded perspective view showing a liquid crystal display according to the embodiment, FIG. 2 is a perspective view showing a light conversion sheet according to the embodiment, FIG. 3 is a sectional view taken along line A-A' of FIG. 2, FIGS. 4 and 5 are sectional views showing various types of light conversion sheets, FIG. 6 is a sectional view showing a light conversion sheet making contact with a light guide plate, and FIG. 7 is a sectional view showing a light conversion sheet according to another embodiment.

Referring to FIGS. 1 to 7, the liquid crystal display (LCD) according to the embodiment includes a backlight unit 10 and a liquid crystal panel 20.

The backlight unit 10 supplies light to the liquid crystal panel 20. The backlight unit 10 serves as a surface light source so that the light can be uniformly supplied to a bottom surface of the liquid crystal panel 20.

The backlight unit 10 is disposed below the liquid crystal panel 20. The backlight unit 10 includes a bottom cover 100, a light guide plate 200, a reflective sheet 300, a plurality of light emitting diodes 400, a printed circuit board 401, and a plurality of optical sheets 500.

The upper portion of the bottom cover 100 is open. The bottom cover 100 receives the light guide plate 200, the light emitting diodes 400, the printed circuit board 401, the reflective sheet 300, and the optical sheets 500 therein.

The light guide plate 200 is disposed in the bottom cover 100 and arranged on the reflective sheet 300. The light guide plate 200 guides the light upward by totally-reflecting, refracting and scattering the light incident thereto from the light emitting diodes 400.

The reflective sheet 300 is disposed below the light guide plate 200. In more detail, the reflective sheet 300 is disposed between the light guide plate 200 and the bottom surface of the bottom cover 100. The reflective sheet 300 reflects the light upward as the light is output downward from the bottom surface of the light guide plate 200.

The light emitting diodes 400 serve as a light source for generating the light. The light emitting diodes 400 are disposed at one lateral side of the light guide plate 200. The light generated from the light emitting diodes 400 is incident into the light guide plate 200 through the lateral side of the light guide plate 200.

The light emitting diodes 400 may include a blue light emitting diode generating the blue light or a UV light emitting diode generating the UV light. In detail, the light emitting diodes 400 may emit the blue light having the wavelength band of about 430 nm to about 470 nm or the UV light having the wavelength band of about 300 nm to about 400 nm.

The light emitting diodes 400 are mounted on the printed circuit board 401. The light emitting diodes 400 may be disposed under the printed circuit board 401. The light emitting diodes 400 are driven by receiving a driving signal through the printed circuit board 401.

The printed circuit board 401 is electrically connected to the light emitting diodes 400. The printed circuit board 401 may mount the light emitting diodes 400 thereon. The printed circuit board 401 is disposed in the bottom cover 100.

The optical sheets 500 are disposed on the light guide plate 200. The optical sheets 500 supplies the light to the liquid crystal panel 20 by changing or enhancing the optical property of the light output from the top surface of the light guide plate 200.

The optical sheets 500 may include a light conversion sheet 501, a first prism sheet 502, and a second prism sheet 503.

The light conversion sheet 501 is disposed on the light guide plate 200. In detail, the light conversion sheet 501 is disposed between the light guide plate 200 and a diffusion sheet. The light conversion sheet 501 outputs the light in the upward direction by converting the wavelength of the incident light.

For instance, if the light emitting diodes 400 are blue light emitting diodes, the light conversion sheet 501 converts the blue light output upward from the light guide plate 200 into the green light and the red light. In detail, the light conversion sheet 501 converts a part of the blue light into the green light having the wavelength in the range of about 520 nm to about 560 nm, and a part of the blue light into the red light having the wavelength in the range of about 630 nm to about 660 nm.

In addition, if the light emitting diodes 400 are UV light emitting diodes, the light conversion sheet 501 converts the UV light output upward from the light guide plate 200 into the blue light, the green light and the red light. In detail, the light conversion sheet 501 converts a part of the UV light into the blue light having the wavelength in the range of about 430 nm to about 470 nm, a part of the UV light into the green light having the wavelength in the range of about 520 nm to about 560 nm, and a part of the UV light into the red light having the wavelength in the range of about 630 nm to about 660 nm.

Therefore, the white light may be generated by the light passing through the light conversion sheet 501 without being converted and the lights converted by the light conversion sheet 501. In detail, the white light can be incident into the liquid crystal panel 20 through the combination of the blue light, the green light and the red right.

That is, the light conversion sheet 501 is a light conversion member that converts the property of the incident light. In detail, the light conversion sheet 501 is an optical member that converts the property of the incident light. The light conversion sheet 501 is a wavelength conversion member that converts a wavelength of the incident light.

As shown in FIGS. 2 and 3, the light conversion sheet 501 includes a lower substrate 510, an upper substrate 520, a light conversion layer 530 and a light diffusion layer 540.

The lower substrate 510 is disposed under the light conversion layer 530. The lower substrate 510 is transparent and flexible. The lower substrate 510 may adhere to a bottom surface of the light conversion layer 530.

For instance, transparent polymer such as PET (polyethyleneterephthalate) can be used as a material for the lower substrate 510.

The upper substrate 520 is disposed on the light conversion layer 530. The upper substrate 520 may be transparent and flexible. The upper substrate 520 may adhere to the top surface of the light conversion layer 530.

The upper substrate 520 may include a transparent polymer such as PET.

The light conversion layer 530 is sandwiched between the upper and lower substrates 520 and 510. The upper and lower substrates 520 and 510 support the light conversion layer 530. The upper and lower substrates 520 and 510 protect the light conversion layer 530 from external physical impact.

In addition, the upper and lower substrates 520 and 510 have low oxygen permeability and low moisture permeability. Thus, the upper and lower substrates 520 and 510 can protect the light conversion layer 530 from external chemical penetration by oxygen and/or moisture.

The light conversion layer 530 is interposed between the lower and upper substrates 510 and 520. The light conversion layer 530 may adhere to the top surface of the lower substrate 510, and adhere to the bottom surface of the upper substrate 520.

The light conversion layer 530 includes a plurality of light conversion particles 531 and a first host layer 532.

The light conversion particles 531 are disposed between the lower substrate 510 and the upper substrate 520. In detail, the light conversion particles 531 are uniformly distributed in the first host layer 532 and the first host layer 532 is disposed between the lower substrate 510 and the upper substrate 520.

The light conversion particles 531 convert the wavelength of the light emitted from the light emitting diodes 400. In detail, the light conversion particles 531 receive light emitted from the light emitting diodes 400 to convert the wavelength of the incident light. For instance, the light conversion particles 531 may convert the blue light emitted from the light emitting diodes 400 into the green light and the red light. That is, a part of the light conversion particles 531 may convert the blue light into the green light having the wavelength in the range of about 520 nm to about 560 nm and a part of the light conversion particles 531 may convert the blue light into the red light having the wavelength in the range of about 630 nm to about 660 nm.

In addition, the light conversion particles 531 may convert the UV light emitted from the light emitting diodes 400 into the blue light, the green light and the red light. That is, a part of the light conversion particles 531 may convert the UV light into the blue light having the wavelength in the range of about 430 nm to about 470 nm, a part of the light conversion particles 531 may convert the UV light into the green light having the wavelength in the range of about 520 nm to about 560 nm and a part of the light conversion particles 531 may convert the UV light into the red light having the wavelength in the range of about 630 nm to about 660 nm.

That is, if the light emitting diodes 400 are blue light emitting diodes that emit the blue light, the light conversion particles 531 capable of converting the blue light into the green light and the red light can be employed. In addition, if the light emitting diodes are UV light emitting diodes that emit the UV light, the light conversion particles 531 capable of converting the UV light into the blue light, the green light and the red light can be employed.

The light conversion particles 531 may be prepared as quantum dots (QD). The quantum dots may include core nano-crystals and shell nano-crystals surrounding the core nano-crystals. In addition, the quantum dots may include organic ligands bonded to the shell nano-crystals. Further, the quantum dots may include an organic coating layer surrounding the shell nano-crystals.

The shell nano-crystals may be prepared as at least two layers. The shell nano-crystals are formed on the surface of the core nano-crystals. The quantum dots lengthen the wavelength of the light incident into the core nano-crystals by using the shell nano-crystals forming a shell layer, thereby improving the light efficiency.

The quantum dots may include at least one of a group-II compound semiconductor, a group-III compound semiconductor, a group-V compound semiconductor, and a group-VI compound semiconductor. In more detail, the core nano-crystals may include CdSe, InGaP, CdTe, CdS, ZnSe, ZnTe, ZnS, HgTe or HgS. In addition, the shell nano-crystals may include CuZnS, CdSe, CdTe, CdS, ZnSe, ZnTe, ZnS, HgTe or HgS. The quantum dot may have a diameter of about 1 nm to about 10 nm.

The wavelength of the light emitted from the quantum dots can be adjusted according to the size of the quantum dots. The organic ligand may include pyridine, mercapto alcohol, thiol, phosphine and phosphine oxide. The organic ligand may stabilize the unstable quantum dots after the synthesis process. Dangling bonds may be formed at the valence band and the quantum dots may be unstable due to the dangling bonds. However, since one end of the organic ligand is the non-bonding state, the one end of the organic ligand is bonded with the dangling bonds, thereby stabilizing the quantum dots.

In particular, if the size of the quantum dot is smaller than the Bohr radius of an exciton, which consists of an electron and a hole excited by light and electricity, the quantum confinement effect may occur, so that the quantum dot may have the discrete energy level. Thus, the size of the energy gap is changed. In addition, the charges are confined within the quantum dot, so that the light emitting efficiency can be improved.

Different from general fluorescent pigments, the fluorescent wavelength of the quantum dot may vary depending on the size of the particles. In detail, the light has the shorter wavelength as the size of the particle is reduced, so that the fluorescent light having the wavelength band of visible ray can be generated by adjusting the size of the particles. In addition, the quantum dot represents the extinction coefficient which is 100 to 1000 times higher than that of the general pigment and has the superior quantum yield as compared with the general pigment, so that strong fluorescent light can be generated.

The quantum dots can be synthesized through the chemical wet scheme. The chemical wet scheme is to grow the particles by immersing the precursor material in the organic solvent. According to the chemical wet scheme, the quantum dots can be synthesized.

The first host layer 532 surrounds the light conversion particles 531. That is, the light conversion particles 531 are uniformly distributed in the first host layer 532. The first host layer 532 may include polymer. The first host layer 532 is transparent. That is, the first host layer 532 may include transparent polymer.

The first host layer 532 is disposed between the lower substrate 510 and the upper substrate 520. The first host layer 532 may adhere to the top surface of the lower substrate 510, and adhere to the bottom surface of the upper substrate 520.

The light diffusion layer 540 is disposed under the lower substrate 510. The light diffusion layer 540 is disposed on the bottom surface of the lower substrate 510. In more detail, the light diffusion layer 540 may adhere to the bottom surface of the lower substrate 510. The light diffusion layer 540 may be coated on the entire surface of the lower substrate 510.

The light diffusion layer 540 may convert the route of the incident light. In detail, the light diffusion layer 540 can randomly covert the route of the incident light. Thus, the light diffusion layer 540 can improve the brightness uniformity of the incident light. The light diffusion layer 540 uniformly outputs the light, which is incident thereto from the light guide plate 200, to the light diffusion layer 540.

In addition, the light diffusion layer 540 may serve as a protective layer. That is, the light diffusion layer 540 as well as the lower substrate 510 may protect the light conversion layer 530 from the penetration of oxygen/moisture.

The light diffusion layer 540 may have a thickness in a range of about 5 μm to about 100 μm. The light diffusion layer 540 includes a second host layer 541 and a light path conversion particles 542.

The second host layer 541 surrounds the light path conversion particles 542. The second host layer 541 may uniformly distribute the light path conversion particles 542.

The second host layer 541 is disposed on the bottom surface of the lower substrate 510. The second host layer 541 is coated on the bottom surface of the lower substrate 510. In detail, the second host layer 541 adheres to an entire bottom surface of the lower substrate 510.

The second host layer 541 is transparent. The second host layer 541 has a thickness T1 in a range of about 5 μm to about 100 μm. The second host layer 541 includes transparent polymer. In detail, the second host layer 541 may include epoxy resin or silicon resin. That is, the second host layer 541 is a resin layer consisting of resin.

The light path conversion particles 542 are disposed in the second host layer 541. The light path conversion particles 542 are uniformly distributed in the second host layer 541. The light path conversion particles 542 may be disposed on the entire bottom surface of the lower substrate 510.

The light path conversion particles 542 may be transparent. The light path conversion particles 542 may have a refractive index different from that of the second host layer 541. For instance, the light path conversion particles 542 may have a refractive index higher than that of the second host layer 541. In detail, the second host layer 541 has a refractive index of about 1.2 to about 1.6 and the light path conversion particles 542 have a refractive index of about 1.3 to about 2.1. The difference of the refractive index between the light path conversion particles 542 and the second host layer 541 is in the range of about 0.05 to about 0.8.

The light path conversion particles 542 may include silicon oxide, aluminum oxide, tantalum oxide, polymethylmethacrylate (PMMA), polybutylmethacrylate (PBMA), silica, boehmite, polystyrene or titanium oxide.

The light path conversion particles 542 may have a spherical shape, a polygonal shape or a column shape. In detail, the light path conversion particles 542 may be prepared in the form of beads.

A diameter R of the light path conversion particles 542 may be smaller than the thickness T1 of the second host layer 541. For instance, the thickness T1 of the second host layer 541 is 1.1 times larger than the diameter R of the light path conversion particles 542. In detail, the thickness T1 of the second host layer 541 is 1.1 to 20 times larger than the diameter R of the light path conversion particles 542.

Referring to FIG. 4, the diameter R of the light path conversion particles 542 may be similar to the thickness T2 of the second host layer 541. The diameter R of the light path conversion particles 542 may correspond to the thickness T2 of the second host layer 541. The diameter R of the light path conversion particles 542 may be substantially equal to the thickness T2 of the second host layer 541. For instance, the thickness T2 of the second host layer 541 is about 0.9 to 1.1 times larger than the diameter R of the light path conversion particles 542.

Therefore, fine protrusions 543 may be formed in the second host layer 541 corresponding to the light path conversion particles 542. The thickness of the second host layer 541 may be determined depending on the ratio of resin composition to form the second host layer 541. In addition, the thickness T2 of the second host layer 541 may vary depending on viscosity of the resin composition.

The thickness T2 of the second host layer 541 may be in the range of about 5 μm to about 7 μm. In addition, the diameter R of the light path conversion particles 542 may be in the range of about 5 μm to about 7 μm.

Referring to FIG. 5, the diameter R of the light path conversion particles 542 may be larger than the thickness T3 of the second host layer 541. That is, the thickness T3 of the second host layer 541 may be significantly smaller than the diameter R of the light path conversion particles 542. For instance, the thickness T3 of the second host layer 541 may be smaller than 9/10 of the diameter R of the light path conversion particles 542. In detail, the thickness T3 of the second host layer 541 may in the range of about 6/10 to about 8/10 of the diameter R of the light path conversion particles 542.

Therefore, the protrusions 543 are formed in the second host layer 541 corresponding to the light path conversion particles 542. The thickness T3 of the second host layer 541 may be determined depending on the ratio of resin composition to form the light path conversion particles 542 and the second host layer 541. In addition, the thickness T3 of the second host layer 541 may vary depending on viscosity of the resin composition.

For instance, the second host layer 541 may have a thickness T3 of about 5 μm or less. In detail, the second host layer 541 may have a thickness T3 of about 1.5 μm to about 4 μm.

As shown in FIG. 6, the protrusions 543 may directly make contact with the top surface of the light guide plate 200. The bottom surface of the light conversion sheet 501 may uniformly make contact with the top surface of the light guide plate 200 by the protrusions 543. In addition, the contact area between the light conversion sheet 501 and the light guide plate 200 may be reduced by the protrusions 543. In particular, the protrusions 543 can prevent the light conversion sheet 501 from partially making contact with the light guide plate 200.

Thus, the light conversion sheet 501 and the LCD according to the embodiment may have the improved brightness uniformity.

Referring to FIG. 7, the lower substrate 510 may be omitted. That is, the light diffusion layer 540 can directly make contact with the light conversion layer 530. In detail, the second host layer 541 can directly make contact with the light diffusion layer 540. In more detail, the first host layer 532 can directly make contact with the second host layer 541.

That is, the light diffusion layer 540 can improve the brightness uniformity while sealing the light conversion layer 530. In addition, since the lower substrate 510 is omitted, the light conversion sheet 501 may have a thin thickness.

The first prism sheet 502 is provided on the diffusion sheet 502. The second prism sheet 503 is provided on the first prism sheet 502. The first prism sheet 502 and the second prism sheet 503 may improve the linearity of light passing therethrough.

The liquid crystal panel 20 is disposed on the optical sheets 500. In addition, the liquid crystal panel 20 is disposed on a panel guide 23. The liquid crystal panel 20 is guided by the panel guide 23.

The liquid crystal panel 20 displays images by adjusting intensity of light passing through the liquid crystal panel 20. In detail, the liquid crystal panel 20 is a display panel for displaying the images by using the light emitted from the backlight unit 10. The liquid crystal panel 20 includes a TFT substrate 21, a color filter substrate 22 and a liquid crystal layer interposed between the two substrates. In addition, the liquid crystal panel 20 includes polarizing filters.

Hereinafter, the TFT substrate 21 and the color filter substrate 22 will be described in detail although it is not shown in the drawings in detail. The TFT substrate 21 includes a plurality of gate lines and a plurality of data lines crossing the gate lines to define pixels and a thin film transistor (TFT) is provided at each intersection such that the thin film transistor TFT can be connected to a pixel electrode of the pixel in one-to-one correspondence. The color filter substrate 22 includes color filters having R, G and B colors corresponding to the pixels, a black matrix covering the gate lines, data lines and thin film transistors within the limit of the color filters, and a common electrode covering the above elements.

A driving PCB 25 is provided at an outer peripheral portion of the liquid crystal panel 20 to supply driving signals to the gate lines and data lines.

The driving PCB 25 is electrically connected to the liquid crystal panel 20 by a COF (chip on film) 24. The COF 24 may be replaced with a TCP (tape carrier package).

As described above, the LCD according to the embodiment includes the light diffusion layer 540 disposed under the light conversion layer 530. Thus, the light emitted from the light emitting diode 400 can be uniformly distributed through the light conversion layer 530. That is, the light incident into the light conversion layer 530 may have the improved brightness uniformity.

Therefore, the light conversion layer 530 can convert the light having the improve brightness uniformity, so the light conversion efficiency can be improved. That is, the light output from the light guide plate 200 may not be locally concentrated on the light conversion layer 530, but can be uniformly incident into the light conversion layer 530. Thus, the light conversion performance of the light conversion layer 530 can be maximized.

Since the light conversion layer 520 can improve the brightness uniformity of the light, the LCD according to the embodiment does not require an additional diffusion sheet. Thus, the LCD according to the embodiment may have the slim structure.

In addition, the light diffusion layer 540 includes the light path conversion particles 542. Further, the light diffusion layer 540 includes the protrusions 543 corresponding to the light path conversion particles 542. The protrusions 543 may protrude downward.

Especially, the protrusions 543 can directly make contact with the light guide plate 200 disposed below the protrusions 543. Due to the protrusions 543, the uniform contact area can be formed between the light conversion sheet 501 and the light guide plate 200.

Therefore, the brightness non-uniformity, which is caused due to the local contact between the light conversion sheet 510 and the light guide plate 200, can be prevented by the protrusions 543.

Thus, the LCD according to the embodiment can maximize the light conversion efficiency of the light conversion layer 530 while improving the brightness uniformity.

Hereinafter, the light emitting device according to the embodiment will be described with reference to FIGS. 8 to 11.

FIG. 8 is a perspective view showing a light emitting device package according to the embodiment, FIG. 9 is a sectional view taken along line C-C' of FIG. 8, FIG. 10 is a sectional view showing a light emitting diode chip according to the first embodiment, and FIG. 11 is a sectional view showing a light emitting diode chip according to the second embodiment. In the description about the light emitting device package according to the embodiment, the previous description about the light conversion sheet will be incorporated by reference. That is, the previous description of the light conversion sheet may be basically incorporated herein by reference except for the modified parts.

Referring to FIGS. 8 to 11, the light emitting device package according to the embodiment includes a body 810, a plurality of lead electrodes 821 and 822, a light emitting part 830, a filling part 840, a plurality of light conversion particles 850 and a plurality of light path conversion particles 884.

The body 810 receives the light emitting part 830, the filling part 840, and the light conversion particles 850 therein and supports the lead electrodes 821 and 822.

The body 810 may be formed by using one of a resin material, such as PPA, a ceramic material, liquid crystal polymer (LCP), syndiotactic (SPS), poly phenylene ether (PPS), and a silicon material, but the embodiment is not limited thereto. The body 810 can be integrally formed through the injection molding or can be formed by laminating a plurality of layers.

The body 810 includes a cavity C having an open upper portion. The cavity C can be formed by patterning, punching, cutting or etching the body 810. In addition, the cavity C can be formed by using a metal mold having the structure equal to the structure of the cavity C when the body 810 is formed.

The cavity C may have a cup shape or a concave vessel shape. In addition, the cavity C may have a surface of a circular shape, a polygonal shape or a random shape, but the embodiment is not limited thereto.

The inner wall of the cavity C may be vertical or inclined to the bottom surface of the cavity C by taking the light distribution angle of the light emitting device package into consideration.

The body 810 may include a base part 811 and a receiving part 812.

The base part 811 supports the receiving part 812. In addition, the base part 811 supports the lead electrodes 821 and 822. For instance, the base part 811 may have a rectangular parallelepiped shape.

The receiving part 812 is disposed on the base part 811. The cavity C is defined by the receiving part 812. That is, the cavity C is a groove formed in the receiving part 812. The receiving part 812 surrounds the cavity C. When viewed from the top, the receiving part 812 may have a closed loop shape. For instance, the receiving part 812 may have a wall shape surrounding the cavity C.

The receiving part 812 includes a top surface, an outer surface and an inner surface. The inner surface is an inclined surface, which is inclined with respect to the top surface.

The lead electrodes 821 and 822 can be realized as a lead frame, but the embodiment is not limited thereto.

The lead electrodes 821 and 822 are disposed in the body 810 and installed on the bottom surface of the cavity C while being electrically isolated from each other. Outer portions of the lead electrodes 821 and 822 are exposed out of the body 810.

End portions of the lead electrodes 821 and 822 are located at one lateral side or the other lateral side of the cavity C.

The lead electrodes 821 and 822 can be prepared as lead frames, which can be formed when the body 810 is injection molded. For instance, the lead electrodes 821 and 822 include a first lead electrode 821 and a second lead electrode 822.

The first lead electrode 821 is spaced apart from the second lead electrode 822. In addition, the first lead electrode 821 and the second lead electrode 822 are electrically connected to the light emitting part 830.

The light emitting part 830 includes at least one light emitting diode chip. For instance, the light emitting part 830 may include a blue light emitting diode chip or a UV light emitting diode chip.

The light emitting part 830 may be a lateral type light emitting diode chip or a vertical type light emitting diode chip. As shown in FIG. 11, the light emitting part 830 may include a conductive substrate 831, a light reflective layer 832, a first conductive semiconductor layer 833, a second conductive semiconductor layer 834, an active layer 835 and a second electrode 836.

The conductive substrate 831 consists of a conductor. The conductive substrate 831 supports the light reflective layer 832, the first conductive semiconductor layer 833, the second conductive semiconductor layer 834, the active layer 835 and the second electrode 836.

The conductive substrate 831 is connected to the first conductive semiconductor layer 833 through the light reflective layer 832. That is, the conductive substrate 831 serves as a first electrode for supplying an electric signal to the first conductive semi-conductor layer 833.

The light reflective layer 832 is disposed on the conductive substrate 831. The light reflective layer 832 reflects the light emitted from the active layer 835 in the upward direction. In addition, the light reflective layer 832 is a conductive layer. Thus, the light reflective layer 832 connects the conductive substrate 831 to the first conductive semiconductor layer 833. The light reflective layer 832 may be formed by using a metal, such as Ag or Al.

The first conductive semiconductor layer 833 is formed on the light reflective layer 832. The first conductive semiconductor layer 833 has a first conductive type. The first conductive semiconductor layer 833 is an N type semiconductor layer. For instance, the first conductive semiconductor layer 833 is an N type GaN layer.

The second conductive semiconductor layer 834 is formed on the first conductive semiconductor layer 833. The second conductive semiconductor layer 834 is a P type semiconductor layer facing the first conductive semiconductor layer 833. For instance, the second conductive semiconductor layer 834 is a P type GaN layer.

The active layer 835 is interposed between the first conductive semiconductor layer 833 and the second conductive semiconductor layer 834. The active layer 835 may have a single quantum well structure or a multiple quantum wall structure. The active layer 835 may have a periodicity of an InGaN well layer and an AlGaN barrier layer or an InGaN well layer and a GaN barrier layer. The light emitting material for the active layer 835 may vary depending on the light emission wavelengths, such as the blue, red and green wavelengths.

The second electrode 836 is formed on the second conductive semiconductor layer 834. The second electrode 836 is connected to the second conductive semiconductor layer 834.

Meanwhile, the light emitting part 830 may be a lateral type LED. An additional wire may be necessary to connect the lateral type LED to the first lead electrode 821.

The light emitting part 830 is connected to the first lead electrode 821 through a bump and connected to the second lead electrode 822 through a wire. In particular, the light emitting part 830 can be directly formed on the first lead electrode 821.

Besides the above, the light emitting part 830 can be connected to the first and second lead electrodes 821 and 822 through the wire bonding, the die bonding or the flip bonding scheme, but the embodiment is not limited thereto.

The filling part 840 is formed in the cavity C. The filling part 840 is transparent. The filling part 840 may include a material, such as silicon or epoxy, or a material having the refractive index of 2 or less. The filling part 840 covers the light emitting part 830. The filling part 840 may directly make contact with the light emitting part 830.

A reflective layer can be formed on the inner wall of the cavity C. The reflective layer may include a material having high reflective property, such as white PSR (photo solder resist) ink, Ag or Al.

As shown in FIGS. 9 and 10, the light conversion member 880 is formed on the surface of the filling part 840 in the form of a sheet, that is, in the form of the layered structure. In detail, the solution including the host 881 and the light conversion particles 882 is coated on the filling part 840 in a state in which the solvent is not removed, and then the solvent is evaporated. Thus, the light conversion member 880 is formed as the layered structure.

The light conversion member 880 is substantially identical to the light conversion sheet that has been described above. That is, the light conversion member 880 includes a light conversion layer including a plurality of light conversion particles to convert the wavelength of the light emitted from a light source; and a light diffusion layer disposed before the light conversion layer on the basis of the light path from the light source and including a plurality of light path conversion particles. The light conversion member 880 may include a plurality of protrusions protruding toward the optical member.

That is, the light conversion member includes a light conversion layer having a first host 881 and a plurality of light conversion particles 882 distributed in the first host, a second host 883 and a plurality of light path conversion particles 884 distributed in the second host.

The light conversion member according to the previous embodiments can be applied to the light conversion member 880 of the light emitting device according to the present embodiment, so the detailed description thereof will be omitted.

The light conversion particles 882 can convert may convert the blue light emitted from the light emitting part 830 into the green light. In detail, the light conversion particles 882 may convert the blue light emitted from the light emitting part 830 into the light having the wavelength band in the range of about 500 nm to about 599 nm.

In addition, the light conversion particles 882 may convert the blue light emitted from the light emitting part 830 into the green light. In detail, the light conversion particles 882 may convert the blue light emitted from the light emitting part 830 into the light having the wavelength band in the range of about 600 nm to about 700 nm.

Further, when the light emitting part 830 emits the UV light, the light conversion particles 882 may convert the radiant UV light into the blue light.

That is, the light conversion particles 882 receive the light emitted from the light emitting part 830 and convert the wavelength of the light. As described above, the light conversion particles 882 can convert the incident blue light into the green light and red light.

In addition, the light conversion particles 882 can convert the UV light emitted from the light emitting part 830 into the blue light, the green light and red light.

Thus, the white light can be generated by the light converted by the light conversion particles 882 and the light which is not converted by the light conversion particles 882. That is, the white light can be emitted through the combination of the blue light, green light and red light.

Hereinafter, the lighting device according to the embodiment will be described with reference to FIG. 12.

FIG. 12 is a perspective view showing the lighting device according to the embodiment. Referring to FIG. 12, the lighting device 900 includes a case 910, a light emitting module 930 installed in the case 910, and a connection terminal 920 installed in the case 910 to receive power from an external power source.

Preferably, the case 910 includes a material having superior heat dissipation property. For instance, the case 910 includes a metallic material or a resin material.

The light emitting module 930 may include a substrate 932 and light emitting device packages 931 according to the embodiment, which are installed on the substrate 932. The light emitting device packages 931 are spaced apart from each other or arranged in the form of a matrix. The light emitting device packages 931 can be basically incorporated with the light emitting device that has been previously described with reference to FIGS. 8 to 11.

The light emitting device package may include a light conversion member including a light conversion layer having a plurality of light conversion particles to convert the wavelength of the light emitted from a light source; and a light diffusion layer disposed before the light conversion layer on the basis of the light path from the light source and including a plurality of light path conversion particles. In addition, the light emitting device package may include an optical member including a plurality of protrusions.

That is, the light conversion member includes a light conversion layer having a first host 881 and a plurality of light conversion particles 882 distributed in the first host, a second host 883 and a plurality of light path conversion particles 884 distributed in the second host.

The substrate 932 includes an insulating member printed with a circuit pattern. For instance, the substrate 932 includes a PCB (printed circuit board), an MC (metal core) PCB, an FPCB (flexible PCB), a ceramic PCB, and an FR-4 substrate.

In addition, the substrate 932 may include a material that effectively reflects the light. A coating layer can be formed on the surface of the substrate 932. At this time, the coating layer has a white color or a silver color to effectively reflect the light.

At least one light emitting device package 931 is installed on the substrate 932. Each light emitting device package 931 may include at least one LED (light emitting diode) chip. The LED chip may include an LED that emits the light of visible ray band having red, green, blue or white color and a UV (ultraviolet) LED that emits UV light.

The light emitting device packages 931 of the light emitting module 930 can be variously combined to provide various colors and brightness. For instance, the white LED, the red LED and the green LED can be combined to achieve the high color rendering index (CRI).

The connection terminal 920 is electrically connected to the light emitting module 930 to supply power to the light emitting module 930. The connection terminal 920 has a shape of a socket screw-coupled with the external power source, but the embodiment is not limited thereto. For instance, the connection terminal 920 can be prepared in the form of a pin inserted into the external power source or connected to the external power source through a wire.

That is, the optical member and the light emitting device described above can be employed in the lighting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device, comprising:
 a light source;
 a PCB (printed circuit board) having the light source mounted thereon;
 a light guide plate into which light from the light source is incident;
 a light conversion member on the light guide plate;
 a panel guide on the light conversion member; and
 a display panel into which the light from the light conversion member is incident,
 wherein the light source is disposed at a lateral side of the light guide plate,
 wherein the PCB is disposed under the light source and extends along the light guide plate,
 wherein the display panel is disposed on the panel guide,
 wherein the panel guide comprises an open area and a closed area,
 wherein a center part of the light conversion member is exposed through the open area,
 wherein an outer part of the light conversion member is covered by the closed area,
 wherein the light conversion member comprises:
 a lower substrate;
 an upper substrate on the lower substrate;
 a light conversion layer including a plurality of quantum dots (QD) to convert a wavelength of the light emitted from the light source; and
 a light diffusion layer disposed before the light conversion layer on a basis of a path of the light from the light source and including a plurality of light path conversion particles,
 wherein the light diffusion layer includes a second host layer surrounding the light path conversion particles, the second host layer comprising a plurality of protrusions directly contacting the light guide plate such that a contact area between the light conversion layer and the light guide plate is reduced, each light path conversion particle of the plurality of light path conversion particles being in direct contact with a bottom surface of the light conversion layer and being buried in each protrusion of the plurality of protrusions, respectively, and a thickness of portions of the second host layer without the protrusions being substantially same as a diameter of the light path conversion particles;
 wherein the protrusions make direct contact with the light guide plate,
 wherein the light conversion layer is disposed between the lower substrate and the upper substrate,
 wherein the light conversion layer is in direct physical contact with a bottom surface of the upper substrate and an upper surface of the lower substrate,
 wherein the light diffusion layer is in direct physical contact with a bottom surface of the lower substrate,
 wherein the plurality of quantum dots (QD) include core nano-crystals and shell nano-crystals respectively surrounding the core nano-crystals,
 wherein each shell nano-crystal is prepared as at least two layers,
 wherein the light diffusion layer has a thickness in a range of from 5 μm to 100 μm,
 wherein the light diffusion layer includes epoxy resin or silicon resin,
 wherein the light path conversion particles have a refractive index higher than that of the light diffusion layer,
 wherein the refractive index of the light path conversion particles is in a range of from 1.3 to 2.1, and
 wherein the refractive index of the light diffusion layer is in a range of from 1.2 to 1.6.

2. The display device of claim 1, wherein the light conversion layer includes a first host layer surrounding the quantum dots.

3. The display device of claim 2, wherein the light path conversion particles include silicon oxide, aluminum oxide, tantalum oxide, polymethylmethacrylate (PMMA), polybutylmethacrylate (PBMA), silica, boehmite, polystyrene or titanium oxide.

4. The display device of claim 2, wherein a difference in refractive index between the light diffusion layer and the light path conversion particle is in a range of 0.05 to 0.8.

5. The display device of claim 1, wherein each of the lower substrate and the upper substrate comprises polyethyleneterephthalate (PET).

6. The display device of claim 5, wherein the protrusions comprise curved surfaces, respectively, that make direct contact with the light guide plate.

7. The display device of claim 1, wherein the light diffusion layer comprises a first surface and a second surface opposite to the first surface,
 wherein the first surface includes a plurality of protrusions, and
 wherein the second surface is flat.

* * * * *